United States Patent
Shida et al.

(10) Patent No.: US 10,644,172 B2
(45) Date of Patent: May 5, 2020

(54) TRANSPARENT ELECTRODE, MANUFACTURING METHOD THEREOF AND ELECTRONIC DEVICE EMPLOYING THE TRANSPARENT ELECTRODE

(71) Applicant: KABUSHIKI KAISHA TOSHIBA, Minato-ku (JP)

(72) Inventors: Naomi Shida, Minato (JP); Katsuyuki Naito, Bunkyo (JP); Mitsunaga Saito, Inzai (JP); Takeshi Niimoto, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/548,372

(22) Filed: Aug. 22, 2019

(65) Prior Publication Data

US 2019/0378940 A1 Dec. 12, 2019

Related U.S. Application Data

(63) Continuation of application No. 15/919,545, filed on Mar. 13, 2018, now Pat. No. 10,431,702.

(30) Foreign Application Priority Data

Jul. 21, 2017 (JP) .................................. 2017-142004

(51) Int. Cl.
*H01L 21/00* (2006.01)
*H01L 21/16* (2006.01)
(Continued)

(52) U.S. Cl.
CPC .. *H01L 31/022483* (2013.01); *G02F 1/13439* (2013.01); *H01L 29/401* (2013.01);
(Continued)

(58) Field of Classification Search
CPC ................ H01L 29/401; H01L 51/442; H01L 31/022483; H01L 31/022425; G02F 1/13439
(Continued)

(56) References Cited

U.S. PATENT DOCUMENTS 5,458,753 A 10/1995 Sato et al.
6,249,369 B1 6/2001 Theiste et al.
(Continued)

FOREIGN PATENT DOCUMENTS

JP 01-253715 10/1989
JP 06-187833 7/1994
(Continued)

OTHER PUBLICATIONS

Youhei Numata, et al., Toin Univ. of Yokohama, "Low temperature prepared perovskite solar cells based on a hetero-metal doped amorphous TiO2 blocking layer," 2017, 3 Pages (with English Translation).

*Primary Examiner* — David S Blum
(74) *Attorney, Agent, or Firm* — Oblon, McClelland, Maier & Neustadt, L.L.P.

(57) ABSTRACT

The present embodiments provide a transparent electrode having a laminate structure of:
  a first metal oxide layer having an amorphous structure and electroconductivity,
  a metal layer made of a metallic material containing silver or copper,
  a second metal oxide layer having an amorphous structure and electroconductivity, and
  a third metal oxide layer having an amorphous structure and continuity, stacked in this order.

9 Claims, 5 Drawing Sheets

(51) Int. Cl.

| | |
|---|---|
| *H01L 31/0224* | (2006.01) |
| *H01L 51/50* | (2006.01) |
| *H01L 51/56* | (2006.01) |
| *H01L 29/40* | (2006.01) |
| *G02F 1/1343* | (2006.01) |
| *H01L 51/44* | (2006.01) |
| *H01L 51/52* | (2006.01) |

(52) U.S. Cl.
CPC ............ *H01L 31/022425* (2013.01); *H01L 31/022475* (2013.01); *H01L 51/442* (2013.01); *H01L 51/5056* (2013.01); *H01L 51/5215* (2013.01); *H01L 51/56* (2013.01); *H01L 2251/308* (2013.01)

(58) Field of Classification Search
USPC .................................... 438/57, 85, 96, 104
See application file for complete search history.

(56) References Cited

U.S. PATENT DOCUMENTS

| | | |
|---|---|---|
| 6,501,217 B2 | 12/2002 | Beierlein et al. |
| 7,428,090 B2 | 9/2008 | Fukazawa et al. |
| 7,940,359 B2 | 5/2011 | Lee |
| 8,907,352 B2 | 12/2014 | Naito |
| 2010/0084013 A1 | 4/2010 | Eo |
| 2013/0146132 A1 | 6/2013 | Kuchiyama |
| 2013/0228219 A1 | 9/2013 | Shishida et al. |
| 2015/0024539 A1 | 1/2015 | Brohan et al. |
| 2015/0144899 A1 | 5/2015 | Verilhac et al. |
| 2015/0311470 A1 | 10/2015 | Guimard et al. |
| 2017/0084772 A1 | 3/2017 | Uto |

FOREIGN PATENT DOCUMENTS

| | | |
|---|---|---|
| JP | 2003-162923 | 6/2003 |
| JP | 3488474 | 1/2004 |
| JP | 2006-164961 | 6/2006 |
| JP | 4105537 | 6/2008 |
| JP | 2009-146981 | 7/2009 |
| JP | 2009-529153 | 8/2009 |
| JP | 4909939 | 4/2012 |
| JP | 2012-089786 | 5/2012 |
| JP | 2013-183030 | 9/2013 |
| JP | 5604899 | 10/2014 |
| JP | 2014-532025 | 12/2014 |
| JP | 2015-144272 | 8/2015 |
| JP | 2015-522947 | 8/2015 |
| JP | 2016-506037 | 2/2016 |
| JP | 2016-081318 | 5/2016 |
| JP | 2017-054912 | 3/2017 |
| JP | 2017-135379 | 8/2017 |
| WO | WO-2011096289 A1 | 8/2011 |

TRANSPARENT ELECTRODE, MANUFACTURING METHOD THEREOF AND ELECTRONIC DEVICE EMPLOYING THE TRANSPARENT ELECTRODE

CROSS-REFERENCE TO RELATED APPLICATIONS

This application is a continuation of U.S. patent application Ser. No. 15/919,545, now U.S. Pat. No. 10,431,545, filed on Mar. 13, 2018, which is based upon and claims the benefit of priority from the prior Japanese Patent Application No. 2017-142004, filed on Jul. 21, 2017, the entire contents of which are incorporated herein by reference.

FIELD

Embodiments of the present disclosure relate to a transparent electrode, a manufacturing method, and an electronic device employing the transparent electrode.

BACKGROUND

According to recent increasing of energy consumption, demand for alternative energy replacing fossil fuels has been rising as measures to cope with global warming. As a source of the alternative energy, solar cells have been attracted the attention and hence progressively developed. They are studied for various practical applications. From a practical viewpoint, it is particularly important to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility and durability. Those devices usually comprise indium-doped tin oxide (hereinafter, often referred to as "ITO") in the form of films serving as transparent electrodes. The ITO films are normally formed by sputtering or the like. In order that the ITO films can have high electroconductivity, it is necessary to carry out the sputtering procedure at a high temperature and to anneal thereafter the formed films at a high temperature. However, it is often the case that organic materials cannot be subjected to those procedures at a high temperature.

Meanwhile, transparent electrodes in electronic devices can be made of ITO/Ag/ITO composite material, which has low electronic resistance and high transparency. There is an examination case in which the composite-material electrode is adopted in a device comprising a PEDOT/PSS layer. Even so, however, amorphous ITO (hereinafter, often referred to as "a-ITO") and silver are liable to be deteriorated by acids or halogens diffusing from the outside or from other layers. Further, silver itself tends to easily migrate into other layers. If migrating into other layers, silver reacts with water or the like to produce silver oxide or the like, so that it may impair the transparent electrode. Not only that, but also the migrating silver may reach into the active area of the electronic device and consequently may lower the performance of the device.

DETAILED DESCRIPTION

Embodiments will now be explained with reference to the accompanying drawings.

The transparent electrode according to the embodiment has a laminate structure of a first metal oxide layer having an amorphous structure and electroconductivity, a metal layer which comprises a metallic material containing silver or copper, a second metal oxide layer having an amorphous structure and electroconductivity, and a third metal oxide layer having an amorphous structure and continuity, stacked in this order.

Further, the electronic device according to the embodiment comprises the above transparent electrode and a counter electrode.

Furthermore, the method according to the embodiment for manufacturing a transparent electrode, comprises the steps of:

(I) preparing a laminate structure of a first metal oxide layer having an amorphous structure and electroconductivity, a metal layer which comprises a metallic material containing silver or copper, and a second metal oxide layer having an amorphous structure and electroconductivity; and thereafter (II) coating the surface of said second metal oxide layer with a metal alkoxide solution, then drying and heating the applied solution at 150° C. or less in a water-containing atmosphere, to form a third metal oxide layer.

The embodiments are described below in detail.

Embodiment 1

Figure 1:
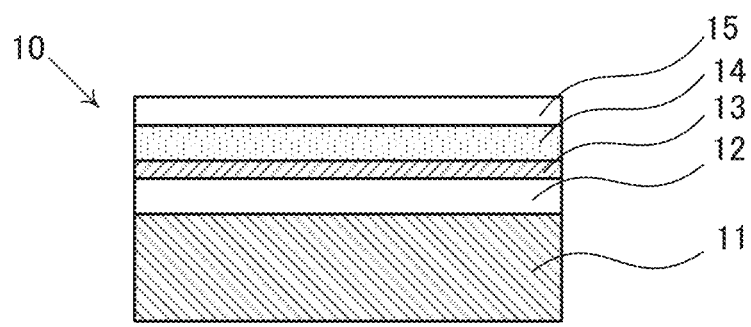
FIG. 1 is a schematic sectional view showing the structure of a transparent electrode according to the embodiment.

First, the structure of the transparent electrode according to the first embodiment is explained with reference to FIG. 1. FIG. 1 schematically shows the structure of a transparent electrode 10 according to the embodiment. The transparent electrode comprises a first metal oxide layer 12/a metal layer 13/a second metal oxide layer 14/a third metal oxide layer 15, stacked in this order. The transparent electrode may be generally formed on a substrate 11. The substrate 11 is not necessarily indispensable, but makes it easy to carry out procedures for producing the transparent electrode. Accordingly, the substrate may be used only in the production process and hence may be removed after the laminate structure of the electrode is formed.

There are no particular restrictions on the material of the substrate. However, if the transparent electrode of the embodiment is employed in combination of the substrate, the substrate preferably has transparency and flexibility. In view of that, preferred are resin materials, such as, polyethylene terephthalate (hereinafter, referred to as "PET") and polyethylene naphthalate (hereinafter, referred to as "PEN"). Further, the substrate is preferably subjected to planarizing treatment.

The first metal oxide layer 12 and the second one 14 contain metal oxides, which can be freely selected from generally known electroconductive metal oxides. Examples thereof include: indium-doped tin oxide (ITO), fluorine-doped tin oxide (FTO), and aluminum-doped zinc oxide AZO). Other metal oxides may be adopted as long as they satisfy the requirements of transparency and electroconductivity. However, one or both of the first and second metal oxide layers preferably contain a metal oxide selected from the group consisting of ITO, AZO and FTC). The first and second metal oxide layers 12 and 14 may contain a substance other than metal oxides, but preferably consist only of metal oxides or metal composite oxides. Among the above, ITO is preferred because the zeta potential thereof is so close to 0 in the neutral pH range as to reduce the interaction with cations or anions.

The first and second metal oxide layers have amorphous structures, from which homogeneous and even layers are easily formed. Further, those metal oxide layers preferably have continuity. The continuity of the metal oxide layer is explained later in detail.

The first and second metal oxide layers are preferably thin enough to improve the transparency and to shorten the production process. On the other hand, however, they are preferably thick enough to reduce the resistance. In view of those, the first and second metal oxide layers preferably have thicknesses of preferably 30 to 200 nm, more preferably 35 to 100 nm, further preferably 40 to 70 nm. The metal oxide layers having thicknesses of 40 to 70 nm are particularly preferred because they have a good balance among transparency, electroconductivity and film-forming time. If the thickness is less than 30 nm, the electroconductivity tends to be lowered. If it is more than 200 nm, the light transmittance and the film-forming time are liable to be impaired and prolonged, respectively. It is necessary to pay attention to those.

The first and second metal oxide layers can be formed, for example, by sputtering at a low temperature. Specifically, the sputtering procedure is preferably carried out at a temperature of 150° C. or less. The sputtering procedure at such a low temperature makes it possible to form a metal oxide film having an amorphous structure. The formed amorphous metal oxide film can be annealed to partly crystalize and thereby to produce a crystalline-amorphous composite film. The annealing procedure is preferably carried out in a high-temperature atmosphere and/or by means of laser annealing technique. However, the annealing procedure is preferably carried out at a temperature of 150° C. or less so that the metal oxide film may not excessively crystalized.

The metal layer placed between the first and second metal oxide layers comprises a metallic material containing silver or copper. Here, the "metallic material containing silver or copper" is a general term which includes silver metal, copper metal, silver-containing alloys, copper-containing alloys, and alloys containing both. While silver has superior electroconductivity but tends to migrate easily, copper has inferior electroconductivity but higher migration resistance than silver and is less expensive than silver. The metal layer preferably consists only of a metallic material containing silver or copper.

The metal layer is preferably thin enough to improve the transparency but preferably thick enough to reduce the resistance. Specifically, the thickness thereof is preferably 4 to 20 nm, more preferably 5 to 15 nm, further preferably 6 to 10 nm. The metal layer 13 can be formed, for example, by sputtering or vapor deposition, and is preferably formed by sputtering. If being thinner than 4 nm, the metal layer tends to be discontinuous. On the other hand, if it is thicker than 20 nm, the transparency tends to be lowered. It is necessary to pay attention to those.

The third metal oxide layer is placed outside of the second one. This means that the metal layer, the second metal oxide layer and the third metal oxide layer are stacked in this order. Since they are stacked in that order, the third metal oxide layer can prevent silver or copper contained in the metal layer from migrating to the outside of the metal layer. Further, acids or halogens entering from the outside of the electrode can be prevented from diffusing into the metal layer.

In order to fully fulfill that function, the third metal oxide layer has continuity. The "continuity" means that crystalline parts existing in the layer do not penetrate in the thickness direction. In the embodiment, the third metal oxide layer necessarily has an amorphous structure. If the whole metal oxide layer consists only of the amorphous structure and hence does not comprise any crystalline structure, the layer has continuity. However, if the metal oxide layer partly contains crystalline parts, there are "gaps" among crystallites contained therein. Accordingly, if the layer contains many crystallites, the gaps are aligned in series in the thickness direction to form a penetrating cavity. The penetrating cavity may serve as a path through which silver, acids or halogens can diffuse, and therefore the layer needs to have a structure in which the above path is not formed for the purpose of preventing the diffusion of silver, acids or halogens.

Even if the third metal oxide layer may contain crystalline parts, it can be said that "the layer has continuity" provided that there are only a small number of or, particularly, no penetrating cavities formed by the crystalline parts aligned in series in the thickness direction. The metal oxide in amorphous state and that in crystalline state are different in reflection and transmission of electron beams and hence show distinguishably different contrasts in an electron microscopic image. It is, therefore, possible to electron-microscopically observe a penetrating cavity formed by the crystalline metal oxide. Thus, whether the metal oxide layer 15 has continuity or not can be judged by observing a section of the third metal oxide layer with an electron microscope.

Specifically, the continuity can be evaluated in the following manner. A section of the third metal oxide layer is observed at a magnification of 100000 times. The objective section is divided into ten 1000 nm-width observed areas, which are individually evaluated. If the penetrating cavities are visually confirmed only in two or less of the ten observed areas, the metal oxide layer is considered to have continuity in the embodiment. The penetrating cavities are preferably found in zero of the ten areas. In other words, it is preferred that no penetrating cavities be found in any of the ten areas.

The third metal oxide layer is preferably thick enough to enhance the effect of preventing migration of metals and the like, but preferably thin enough to reduce the resistance thereof so that electric charge can move easily. In view of those, the third metal oxide layer has a thickness of preferably 5 to 50 nm, more preferably 10 to 40 nm, further preferably 15 to 30 nm.

The second metal oxide layer 14 is preferably thicker than the third one 15. That structure makes it easy to achieve a balance between the electroconductivity and the function of preventing migration of metals.

The third metal oxide layer can be formed by various methods, such as, sputtering and sol-gel processes. However, it is preferred to form the layer by the steps of applying an alcohol solution of metal alkoxide and then heating the applied solution in a water-containing atmosphere. That process makes it possible to form a thin, large-area and even amorphous film.

There is an interface between the third metal oxide layer and the second one. The third metal oxide layer is generally made of materials properly selected according to the aimed use of the transparent electrode, and hence the third and second metal oxide layers are often different in materials from each other. In that case, the interface is inevitably formed therebetween. However, according to necessity, they may comprise the same materials. In that situation, another layer may be provided therebetween or otherwise they may be formed in such different manners as to have different properties, so that the interface can be formed therebetween. If they are formed from the same materials in the same manner, the interface is not formed and accordingly they are regarded as a single metal oxide layer.

The materials of the third metal oxide layer can be properly selected according to the aimed use. For example, they can be selected from the group consisting of titanium oxide, tin oxide, zinc oxide, and zirconium oxide. Those substances easily serve as n-type semiconductors, and transparent electrodes comprising them are preferably employed as cathodes of photoelectric conversion devices. Among them, preferred are titanium oxide and zirconium oxide because stable films thereof can be easily formed and also because the zeta potentials thereof are so close to 0 in the neutral pH range as to reduce the interaction with cations or anions. Further, in consideration of raw material supply, titanium oxide is particularly preferred.

Further, the materials of the third metal oxide layer may be also selected from the group consisting of nickel oxide, molybdenum oxide, iron oxide and copper oxide. Those substances easily serve as p-type semiconductors, and transparent electrodes comprising them are preferably employed as anodes of photoelectric conversion devices. Among them, nickel oxide is preferred because a stable film thereof can be easily formed and also because the zeta potential thereof is so close to 0 in the neutral pH range as to reduce the interaction with cations or anions.

Furthermore, the materials of the third metal oxide layer may be still also selected from the group consisting of silicon oxide and aluminum oxide. Those substances easily form high resistance films, and transparent electrodes comprising them are preferably employed in voltage-drive type elements and touch panels. Among them, aluminum oxide is preferred because a stable film thereof can be easily formed and also because the zeta potential thereof is so close to 0 in the neutral pH range as to reduce the interaction with cations or anions.

The third metal oxide layer can be doped with other ions having a valence different from that of the metal constituting the metal oxide in the layer, so as to improve the electroconductivity of the layer or to change the energy level thereof.

For example, it is preferred to dope a titanium oxide layer with pentavalent elements. Examples of the pentavalent elements include: nitrogen, phosphorus, niobium, vanadium, tantalum, arsenic, antimony and thallium. If doped with those elements, the metal oxide layer tends to behave as an n-type semiconductor layer.

It is also preferred to dope a molybdenum oxide layer with pentavalent elements. Examples of the pentavalent elements include: nitrogen, phosphorus, niobium, vanadium, tantalum, arsenic, antimony and thallium. If doped with those elements, the metal oxide layer tends to behave as a p-type semiconductor layer.

The third metal oxide layer preferably contains oxygen deficiencies, which can bring the layer more amorphous to change the energy level. The oxygen deficiencies can be measured by X-ray photoelectron spectroscopy (XPS).

For example, titanium oxide is preferably represented by $TiO_x$ (in which x is less than 2). The value x less than 2 indicates that the oxide contains oxygen deficiencies, which bring the layer more amorphous. It can be judge by XPS whether or not the titanium oxide contains oxygen deficiencies. If there are oxygen deficiencies, the resultant XPS spectrum shows that the peak corresponding to Ti has a swollen tail on the low-energy side.

The third metal oxide layer may contain carbon or nitrogen, which can bring the layer more amorphous. Those atoms can be measured by XPS.

Further, the third metal oxide layer may contain alkoxy-metal bonds. For example, if a metal alkoxide is used in the process for producing the third metal oxide layer, alkoxy-metal bonds are often introduced into the layer. In that case, some alkoxy-metal bonds in the metal alkoxide are decomposed by oxidation reactions or the like but the others are left. If remaining in the layer, the alkoxy-metal bonds bring the layer more amorphous and enhance the ability to function as an ion barrier. The alkoxy-metal bonds can be measured by IR or XPS. For example, if titanium oxide contains the alkoxy-metal bonds, the resultant XPS spectrum shows that the peak corresponding to oxygen has a swollen tail on the high-energy side.

It is also possible to form a graphene layer in direct contact with the third metal oxide layer. The graphene layer may be positioned on the metal-layer side, on the side opposite to the metal layer or on each side of the third metal oxide layer.

The graphene layer preferably has a laminate structure of 1 or more but 4 or less graphene monomolecular films (hereinafter, often referred to as "monolayer graphemes") on average. The graphene layer is preferably either unsubstituted or doped with nitrogen. The nitrogen-doped graphene layer is preferably used in a cathode. The doping amount (N/C atomic ratio) can be measured by XPS, and is preferably 0.1 to 30 atom %, more preferably 1 to 10 atom %. The graphene layer has such high shielding ability as to prevent acids and halogens from diffusing and thereby to avoid deterioration of the metal oxide layers and the metal layer. As a result, the impurities coming from the outside can be prevented by the graphene layer from entering the photoelectric conversion layer. Further, since containing nitrogen atoms, the nitrogen-doped graphene layer has high acid-trapping ability and hence has higher shielding ability.

The transparent electrode according to the embodiment may further comprise a UV-cut layer and/or a gas-barrier layer. Examples of ultraviolet absorbers usable in the UV-cut layer include: benzophenones, such as, 2-hydroxy-4-methoxy-benzophenone, 2,2-dihydroxy-4-methoxybenzophenone, 2-hydroxy-4-methoxy-2-carboxybenzophenone, and 2-hydroxy-4-n-octoxybenzophenone; benzotriazoles, such as, 2-(2-hydrxy-3,5-ditertiarybutylphenyl)benzotriazole, 2-(2-hydrxy-5-methylphenyl)benzotriazole, and 2-(2-hydrxy-5-tertiaryphenyl)benzotriazole; and salicylic esters, such as, phenyl salicylate and p-octylphenyl salicylate. The absorbers are preferably capable of cutting UV light in the wavelength range of 400 nm or shorter.

The gas-barrier layer blocks preferably water vapor and oxygen, particularly preferably water vapor. That layer is preferably, for example, a film of inorganic substance such as SiN, $SiO_2$, SiC, $SiO_xN_y$, $TiO_2$ or $Al_2O_3$. Further, it may be a super-thin glass sheet. There are no particular restrictions on the thickness of the gas-barrier layer. The gas-barrier layer is preferably thick enough to serve fully as a barrier against gases. On the other hand, however, the layer is preferably thin enough to ensure flexibility or bendability. In view of those, the gas-barrier layer has a thickness of preferably 0.01 to 3000 μm, more preferably 0.1 to 100 μm. The gas-barrier layer has a water-vapor permeability (moisture permeability) of preferably $10^2$ to $10^{-6}$ g/m²·d, more preferably $10^1$ to $10^{-5}$ g/m²·d, further preferably $10^0$ to $10^{-4}$ g/m²·d. The moisture permeability can be measured according to JIS 20208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion assisted deposition; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

If the transparent electrode according to the embodiment comprises a substrate, the substrate is selected according to the aimed use. For example, transparent substrates can be made of inorganic substances, such as, glass; and organic substances, such as, PET. PEN, polycarbonate and PMMA. Particularly preferred is a substrate made of flexible organic substances so that the resultant transparent electrode of the embodiment can have excellent flexibility.

Embodiment 2-1

Figure 2:
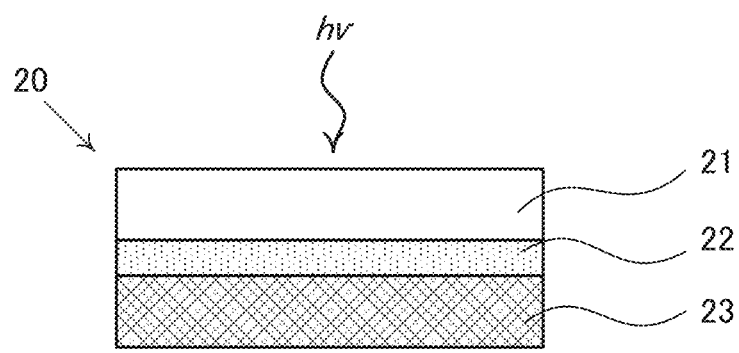
FIG. 2 is a schematic sectional view showing the structure of a photoelectric conversion device (solar cell) according to the embodiment.

The structure of a photoelectric conversion device according to the second embodiment is explained below with reference to FIG. 2. FIG. 2 schematically shows the structure of a solar cell (photoelectric conversion device) 20 according to the embodiment. The solar cell 20 has a function of converting photoenergy hv of incident sunlight or the like into electric power. The solar cell 20 comprises a transparent electrode 21, a photoelectric conversion layer 22 formed on a surface of the transparent electrode 21, and a counter electrode 23 formed on the surface of the photoelectric conversion layer 22 on the side opposite to the transparent electrode 21.

The transparent electrode 21 is the same as that described in Embodiment 1. Specifically, it has a laminate structure of: a first metal oxide layer having an amorphous structure and electroconductivity, a metal layer comprising silver, copper or an alloy thereof, a second metal oxide layer having an amorphous structure and electroconductivity, and a third metal oxide layer which has an amorphous structure and continuity and which is placed on the upside of the second metal oxide layer.

The photoelectric conversion layer 22 is a semiconductor layer which converts photoenergy of incident light into electric power and thereby which generates an electric current. The photoelectric conversion layer 22 generally comprises a p-type semiconductor sublayer and an n-type one. The conversion layer can comprise: a laminate structure of p-type polymer and n-type substance; $RNH_3PbX_3$ (in which X is a halogen ion and R is an alkyl group or the like); silicon semiconductor; inorganic compound semiconductor, such as, InGaAs, GaAs, chalcopyrite type, CdTe type, InP type or SiGe type; or quantum dot-containing or dye-sensitized transparent semiconductor. Any of them can improve the efficiency and can reduce deterioration of power output.

For the purpose of promoting or blocking injection of charges, a buffer layer may be inserted between the conversion layer 22 and the transparent electrode 21.

The counter electrode 23 is normally an opaque metal electrode, but the transparent electrode according to the embodiment may be adopted as the counter electrode 23. Another charge buffer or charge transport layer may be inserted between the counter electrode 23 and the conversion layer 22.

The buffer or charge transport layer for the anode can be made of, for example, vanadium oxide, PEDOT/PSS, p-type polymer, vanadium pentoxide ($V_2O_5$), 2,2',7,7'-tetrakis[N,N-di(4-methoxyphenyl)amino]-9,9'-spirobifluorene (hereinafter, referred to as "spiro-OMeTAD"), nickel oxide (NiO), tungsten trioxide ($WO_3$), or molybdenum trioxide ($MoO_3$).

On the other hand, the buffer or charge transport layer for the cathode, which the transparent electrode serves as, can be made of, for example, lithium fluoride (LIE), calcium (Ca), 6,6'-phenyl-$O_{51}$-butyric acid methyl ester ($C_{60}$-PCBM), 6,6'-phenyl-$C_{71}$-butyric acid methyl ester (hereinafter, referred to as "$C_{70}$-PCBM"), indene-$C_{60}$ bisadduct (hereinafter, referred to as "ICBA"), cesium carbonate ($Cs_2CO_3$), titanium dioxide ($TiO_2$), poly[(9,9-bis(3'-(N,N-dimethylamino)propyl-2,7-fluorene)-alt-2,7-(9,9-dioctyl-fluorene)) (hereinafter, referred to as "PEF"), bathocuproine (hereinafter, referred to as "BCP"), zirconium oxide (ZrO), zinc oxide (ZnO), or polyethyleneimine.

Further, a brookite-type titanium oxide layer can be provided between the photoelectric conversion layer and the transparent electrode. It is known that titanium oxide has three types of crystal structures, namely, rutile, anatase and brookite-type structures. Among them, the titanium oxide layer of brookite-type structure is preferably adopted in the embodiment. The brookite-type titanium oxide layer easily interacts with the photoelectric conversion layer, so that excitons generated by light can easily undergo charge separation. The brookite-type titanium oxide layer preferably comprises nanoparticles of brookite-type titanium oxide. Specifically, the nanoparticles preferably have a mean size of 5 to 30 nm. The particle mean size is measured by a particle size distribution analyzer. Those nanoparticles of brookite-type titanium oxide are commercially available, for example, from KOJUNDO CHEMICAL LABORATORY CO., LTD.

The counter electrode 23 may have the same structure as the transparent electrode 21. Further, the counter electrode 23 may comprise unsubstituted planar monolayer graphenes. The unsubstituted monolayer graphene can be formed by a CVD process in which methane, hydrogen and argon are adopted as the reactive gases and a copper foil sheet is employed as a catalyst undercoat. For example, the monolayer graphene and a thermal transfer film are pressed and stuck together, and then the copper undercoat is dissolved to transfer the monolayer graphene onto the transfer film. The procedure is repeated to stack plural monolayer graphenes on the transfer film. After 2 to 4 graphene layers are thus formed, a metallic connector wiring is printed thereon with silver paste or the like to produce the counter electrode. The unsubstituted graphene may be replaced with graphene in which carbons are partly substituted with boron atoms. The boron-substituted graphene can be formed from the reactive gases of $BH_3$, methane, hydrogen and argon in the same manner as described above. Those graphenes can be transferred from the thermal transfer film onto a proper substrate of, for example, PET.

The mono- or multi-layer graphene can be doped with a tertiary amine serving as an electron donor compound. The electrode comprising the above graphene layer also functions as a transparent electrode.

On the counter electrode 23, a hole transport layer 25 can be formed. The hole transport layer is, for example, a film of ply(3,4-ethyrenedioxythiophene)/poly(styrenesulfonic acid) composite material (PEDOT:PSS). The thickness thereof is, for example, 50 nm.

The solar cell of the embodiment may have a structure sandwiched between two transparent electrodes. The solar cell having that structure can efficiently utilize light incident from both sides. The energy conversion efficiency thereof is generally 5% or more. Characteristically, the solar cell is flexible and can work stably in a long term.

The counter electrode 23 may be an ITO glass transparent electrode in place of the graphene film. In that case, the solar cell loses flexibility but can utilize light energy very efficiently. Further, the counter electrode may be made of metal, such as, stainless steel, copper, titanium, nickel, chromium, tungsten, gold, silver, molybdenum, tin, zinc, or aluminum. However, that metal electrode tends to be inferior in transparency.

The solar cell according to the embodiment can be also employed as a photosensor.

Embodiment 2-2

Figure 3:
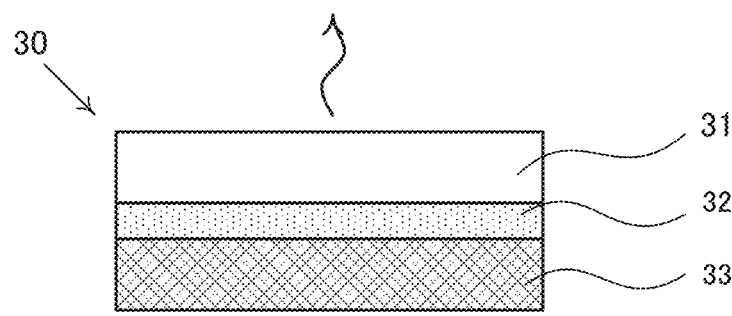
FIG. 3 is a schematic sectional view showing the structure of a photoelectric conversion device (organic EL device) according to the embodiment.

The structure of another photoelectric conversion device according to the second embodiment is explained below with reference to FIG. 3. FIG. 3 schematically shows the structure of an organic EL device (photoelectric conversion device) 30 according to the embodiment. The organic EL device 30 has a function of converting inputted electric energy into light hv. The organic EL device 30 comprises a transparent electrode 31, a photoelectric conversion layer (luminous layer) 32 formed on a surface of the transparent electrode 31, and a counter electrode 33 formed on the surface of the photoelectric conversion layer 32 on the side opposite to the transparent electrode 31.

The transparent electrode 31 is the same as that described in Embodiment 1. The photoelectric conversion layer 32 is an organic thin layer in which charges injected from the transparent electrode 31 and from the counter electrode 33 are recombined to convert the electric energy into light. The photoelectric conversion layer 32 normally comprises a p-type semiconductor sublayer and an n-type one. For the purpose of promoting or blocking injection of charges, a buffer layer may be inserted between the conversion layer 32 and the counter electrode 33. Further, another buffer layer may be inserted between the conversion layer 32 and the transparent electrode 31. The counter electrode 33 is normally a metal electrode but may be a transparent electrode.

Embodiment 2-3

Figure 4:
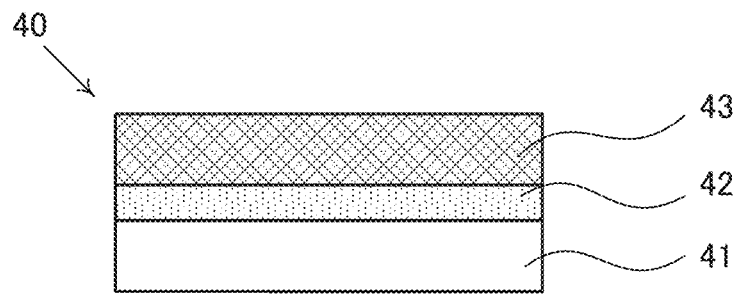
FIG. 4 is a schematic sectional view showing the structure of a liquid crystal device according to the embodiment.

The structure of still another device according to the second embodiment is explained below with reference to FIG. 4. FIG. 4 schematically shows the structure of a liquid crystal device 40 according to the embodiment. The liquid crystal device 40 serves as an optical switch in which orientation of liquid crystal molecules is controlled by application of voltage. The liquid crystal device 40 comprises a transparent electrode 41, a liquid crystal layer 42 formed on a surface of the transparent electrode 41, and a counter electrode 43 formed on the surface of the liquid crystal layer 42 on the side opposite to the transparent electrode 41.

The transparent electrode 41 is the same as that described in Embodiment 1. The liquid crystal layer 42 is preferably made of liquid-crystal microcapsules, which are polymer microcapsules enclosing liquid crystal molecules. The layer of liquid-crystal microcapsules can be formed by wet-coating and drying, and thereafter a metal electrode can be formed thereon by vapor deposition or sputtering.

Embodiment 3

FIGS. 5A-5E schematically illustrate a method of the embodiment for manufacturing a transparent electrode and a device employing the electrode.

First, a first metal oxide layer, a metal layer and a second metal oxide layer are stacked to prepare a laminate structure (Step (I)). There are no particular restrictions on the formation process of the laminate structure. For example, it can be produced in the following manner.

Figure 5A:
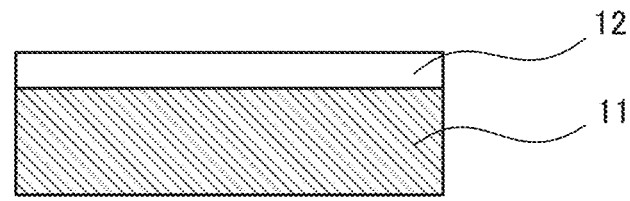
FIGS. 5A-5E schematically illustrate a process for manufacturing a device according to the embodiment.

At the beginning, a first metal oxide layer 12 is formed on a substrate 11 (FIG. 5A). This metal oxide layer is produced by, for example, sputtering at a low temperature.

Figure 5B:
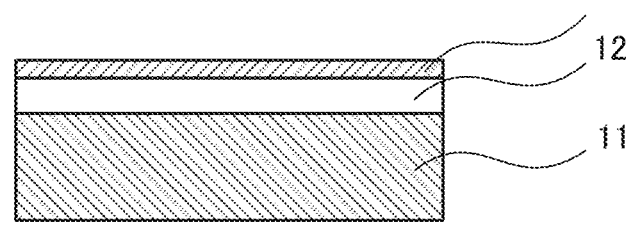

Then, a metal layer 13 is formed on the surface of the metal oxide layer (FIG. 5B). This metal layer is produced by, for example, sputtering or vapor deposition.

Figure 5C:
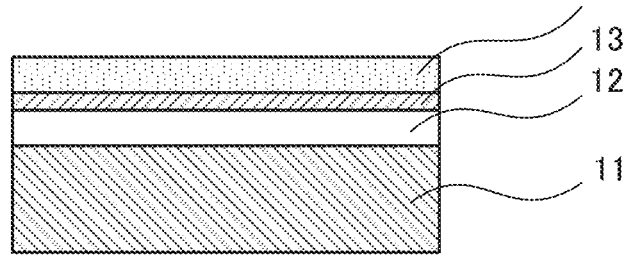

Further, a second metal oxide layer 14 is formed on the surface of the metal layer (FIG. 5C). This metal layer is also produced by, for example, sputtering at a low temperature.

When the first or second metal oxide layer is produced by sputtering, the sputtering temperature is generally room temperature to 150° C. If the temperature is too high, the formed metal oxide layer tends to be less amorphous. It is necessary to pay attention to that. On the other hand, the metal layer can be produced by sputtering at a high temperature. In that case, however, the first metal oxide layer is inevitably exposed to high temperature. It is also necessary to pay attention to that.

Thereafter, a third metal oxide layer 15 is formed on the surface of the second metal oxide layer 14 in the prepared laminate structure. The third metal oxide layer 15 is produced by coating the second metal oxide layer with a metal alkoxide solution and then heating to dry the applied solution (Step (II)).

This step is explained below in detail. The metal alkoxide solution is prepared by dissolving an alkoxide of the metal constituting the third metal oxide layer in water or an organic solvent. The solution is then applied by a desired method, such as, spin coating, spray coating, or bar coating, to form a metal alkoxide solution layer 15a on the surface of the second metal oxide layer (FIG. 5C).

Figure 5D:
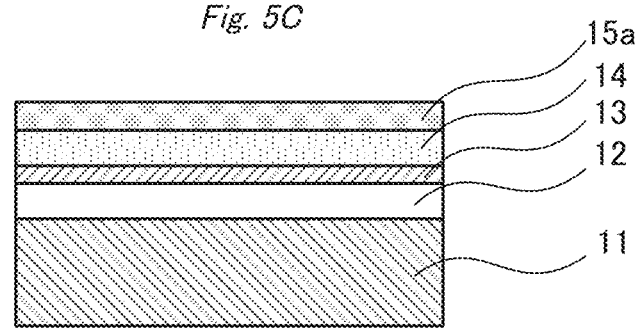

Subsequently, the metal alkoxide solution layer 15a is dried to partly or completely remove the solvent contained therein (FIG. 5D). This drying procedure can be carried out under a reduced pressure, if necessary.

Figure 5E:
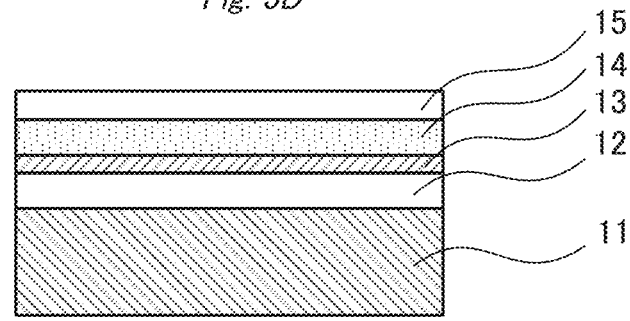

Finally, the coating film of the metal alkoxide solution is heated in a water-containing atmosphere, to form a third metal oxide layer 15 (FIG. 5E). The heating temperature is 150° C. or less, preferably 120° C. or less, so as to prevent crystallization of the first and second metal oxide layers. The heating procedure is carried out in a water-containing atmosphere so as to accelerate the conversion of metal alkoxide into metal oxide. The atmosphere has a humidity of preferably 30% RH or more, further preferably 40% RH or more.

The transparent electrode according to the embodiment can be produced in the manner described above. In addition to the above steps, a graphene layer can be formed on the surface of the second metal oxide layer before the step (II) or on the surface of the third metal oxide layer after the step (II). In that case, the above method preferably further comprises the step in which a solution of graphene oxide is applied and then reduced with hydrazine hydrate.

The transparent electrode thus produced can be used to manufacture various devices. For example, on the surface of the third metal oxide layer in the transparent electrode, a device active part is formed directly or via another layer. Subsequently, a counter electrode is further formed on the surface of the active part directly or via another layer.

The device active part has a structure selected freely according to the aimed use, and there are no particular restrictions on the formation method thereof. The device active part can be formed in any known manner. However, also when the active part is formed, it is necessary to pay attention not to crystallize the metal oxide layers at a high temperature.

The counter electrode can be freely selected according to the aimed use. If the whole device needs to be transparent, the counter electrode may be the transparent electrode of the embodiment. In that case, the third metal oxide layer in the counter electrode is preferably placed on the active part side. If not required to be transparent, the counter electrode may be less transparent.

The counter electrode may be a thin metal film. If the counter electrode is a thin metal film, the thin metal film may be either directly formed on the device active part or independently formed and then stuck thereon.

Further, it is also possible to stack thereon a PET film provided with a UV-cut layer.

EXAMPLES

The embodiments are further explained by the following examples.

Example 1

Figure 6:
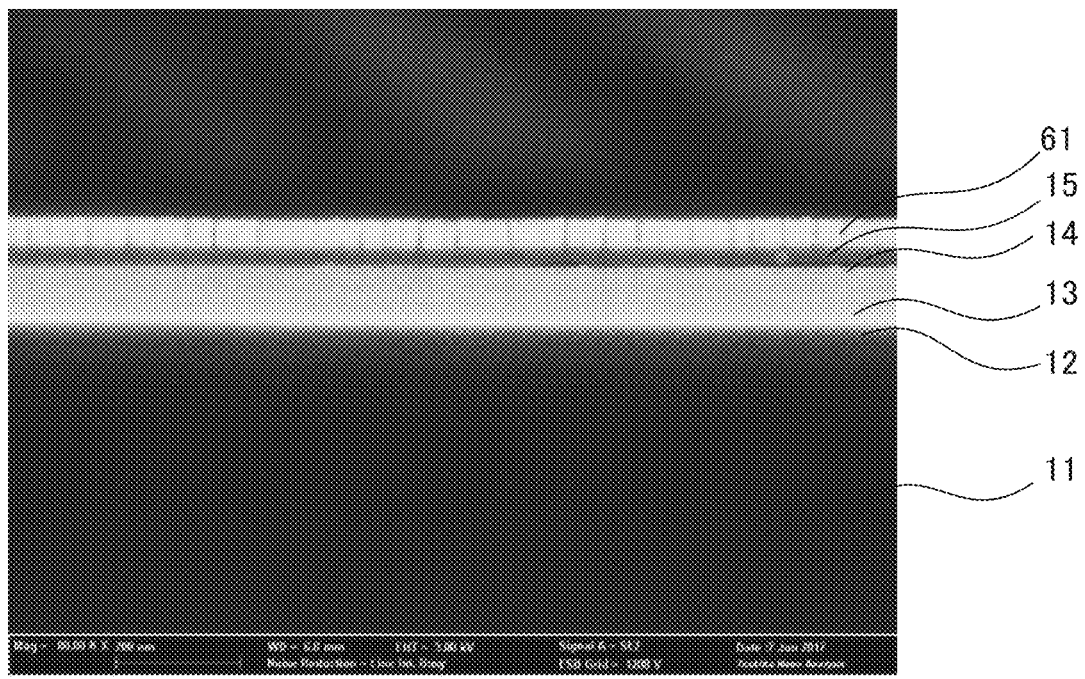
FIG. 6 shows a sectional SEM image of the transparent electrode in Example 1.

A transparent electrode 10 having the structure shown in FIG. 1 is produced. An ITO electroconductive layer 61 is formed by sputtering on a 100-μm thick PET film 11. The ITO electroconductive layer has a laminate structure of a-ITO 12 (thickness: 45 to 52 nm)/silver-Pd alloy 13 (thickness: 5 to 8 nm)/a-ITO 14 (thickness: 45 to 52 nm). The surface resistance is 7 to 10 Ω/square. The laminate structure is then spin-coated with an isopropanol solution containing titanium (IV) isopropoxide and niobium (V) butoxide. The content of niobium (V) butoxide is 5 wt % to that of titanium (IV) isopropoxide. The applied solution is dried in nitrogen at room temperature, and then dried on a hot-plate at 130° C. in an atmosphere having a humidity of 40% to produce a Nb-doped $TiO_x$ layer 15 (thickness: 24 nm). FIG. 6 shows a sectional SEM image of the obtained transparent electrode. The $TiO_x$ layer is amorphous and continuous. In the image, the number 61 represents a thin metal layer for sectional SEM measurement. Ten sectional SEM images at different places are observed, and all of them show that the layer is continuous.

The transparent electrode is left in air at 50° C. for 100 hours, and then evaluated by XPS. As a result, Ag is not detected on the $TiO_x$ surface.

Comparative Example 1

The procedure of Example 1 is repeated except for not spin-coating with the isopropanol solution containing titanium (IV) isopropoxide and niobium (V) butoxide in such amounts that the content of niobium (V) butoxide is 5 wt % to that of titanium (IV) isopropoxide; to produce a transparent electrode.

The transparent electrode is left in air at 50° C. for 100 hours. The resultant electrode shows significantly increased resistance. Further, particles of silver oxide are observed on the surface.

Comparative Example 2

The procedure of Example 1 is repeated except for spin-coating not with the isopropanol solution containing titanium (IV) isopropoxide and niobium (V) butoxide in such amounts that the content of niobium (V) butoxide is 5 wt % to that of titanium (IV) isopropoxide, but with an ethanol dispersion of crystalline titanium oxide nanoparticles; to produce a transparent electrode.

The transparent electrode is left in air at 50° C. for 20 hours, and then evaluated by XPS. As a result, Ag is detected on the $TiO_x$ layer surface, and this indicates that migration occurs.

Comparative Example 3

The procedure of Example 1 is repeated except that the applied solution is not dried in nitrogen at room temperature and then on a hot-plate at 130° C. in an atmosphere having a humidity of 40%, but dried on a hot-plate at 130° C. in an atmosphere having a dew point of −10° C.; to produce a transparent electrode.

The transparent electrode is left in air at 50° C. for 20 hours, and then evaluated by XPS. As a result, Ag is detected on the $TiO_x$ layer surface, and this indicates that migration occurs.

Example 2

An electroconductive layer is formed by sputtering on a 100-μm thick PET film. The electroconductive layer has a laminate structure of a-AZO (thickness: 40 to 50 nm)/silver (thickness: 5 to 8 nm)/a-ITO (thickness: 50 to 55 nm). The surface resistance is 10 to 12 Ω/square. The laminate structure is then spin-coated with an isopropanol solution containing molybdenum (VI) isopropoxide. The applied solution is dried in nitrogen at room temperature, and then dried on a hot-plate at 130° C. in an atmosphere having a humidity of 40% to produce a $MoO_x$ layer (thickness: 20 to 25 nm). A sectional SEM image of the obtained transparent electrode indicates that the $MoO_x$ layer is amorphous and continuous.

The transparent electrode is left in air at 50° C. for 100 hours, and then evaluated by XPS. As a result, Ag is not detected on the MoO$_x$ surface.

Example 3

An electroconductive layer is formed by sputtering on a 100-µm thick PET film. The electroconductive layer has a laminate structure of a-AZO (thickness: 40 to 50 nm)/silver (thickness: 5 to 8 nm)/a-ITO (thickness: 50 to 55 nm). The surface resistance is 10 to 12 Ω/square. The laminate structure is then spin-coated with an isopropanol solution containing nickel isopropoxide. The applied solution is dried in nitrogen at room temperature, and then dried on a hot-plate at 130° C. in an atmosphere having a humidity of 40% to produce a NiO$_x$ layer (thickness: 20 to 25 nm). A sectional SEM image of the obtained transparent electrode indicates that the NiO$_x$ layer is amorphous and continuous.

The transparent electrode is left in air at 50° C. for 100 hours, and then evaluated by XPS. As a result, Ag is not detected on the NiO$_x$ surface.

Example 4

An electroconductive layer is formed by sputtering on a 100-µm thick PET film. The electroconductive layer has a laminate structure of a-ITO (thickness: 50 to 55 nm)/copper (thickness: 5 to 8 nm)/a-ITO (thickness: 50 to 55 nm). The surface resistance is 15 to 20 Ω/square. The laminate structure is then spin-coated with an isopropanol solution containing titanium (IV) isopropoxide. The applied solution is dried in nitrogen at room temperature, and then dried on a hot-plate at 130° C. in an atmosphere having a humidity of 40% to produce a TiO$_x$ layer. A section of the obtained transparent electrode indicates that the TIO$_x$ layer is amorphous and continuous.

The transparent electrode is left in air at 50° C. for 300 hours, and then evaluated by XPS. As a result, copper is not detected on the TiO$_x$ surface.

Example 5

An electroconductive layer is formed by sputtering on a PET film having a thickness of 100 µm. The electroconductive layer has a laminate structure of a-ITO/Ag—Pd alloy/a-ITC). The surface resistance is 5 to 8 Ω/square. The laminate structure is then spin-coated with an ethanol solution containing tetraethoxysilane (TEOS). The applied solution is dried in nitrogen at room temperature, and then dried on a hot-plate at 130° C. in an atmosphere having a humidity of 40% to produce a SiO$_x$ layer. A section of the obtained transparent electrode shows that the SiO$_x$ layer is amorphous and continuous.

The transparent electrode is left in air at 50° C. for 100 hours, and then evaluated by XPS. As a result, Ag is not detected on the SiO$_x$ surface.

Example 6

An electroconductive layer is formed by sputtering on a PET film having a thickness of 100 µm. The electroconductive layer has a laminate structure (thickness: 120 nm) of a-ITO/Ag—Pd alloy/a-ITCH. The surface resistance is 5 to 8 Ω/square. The laminate structure is then spin-coated with an ethanol solution containing isopropoxy aluminum. The applied solution is dried in nitrogen at room temperature, and then dried on a hot-plate at 130° C. in an atmosphere having a humidity of 40% to produce a AlO$_x$ layer. A section of the obtained transparent electrode shows that the AlO$_x$ layer is amorphous and continuous.

The transparent electrode is left in air at 50° C. for 100 hours, and then evaluated by XPS. As a result, Ag is not detected on the AlO$_x$ surface.

Example 7

Figure 7:
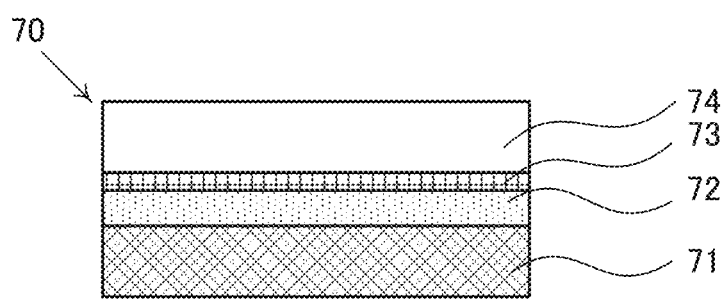
FIG. 7 is a schematic sectional view showing the structure of the transparent electrode in Example 7.

A transparent electrode 70 having the structure shown in FIG. 7 is produced. An electroconductive layer 72 is formed by sputtering on a 100-µm thick PET film 71 in the same manner as in Example 1. The electroconductive layer has a laminate structure of a-ITO/silver-Pd alloy/a-ITC). The surface resistance is 8 to 10 Ω/square. The surface is then coated with a shielding layer in which planar N-graphene films are stacked in four layers on average. Each graphene film comprises carbon atoms partly substituted with nitrogen atoms.

The shielding layer is formed in the following manner. At the beginning, a sheet of Cu-foil is irradiated to heat with laser beams and then annealed to grow crystallites.

The Cu-foil sheet thus surface-treated is adopted as a catalyst undercoat, on which a planar monolayer N-graphene film is formed from a reactive gas mixture of ammonia, methane, hydrogen and argon (15:60:65:200 ccm) by CVD method at 1000° C. for 5 minutes. In most cases, a monolayer N-graphene film is formed as a result of that CVD process. However, depending on the conditions, a two or more-layer N-graphene film is partly formed. Subsequently, the formed N-graphene film is further treated in an ammonia-argon mixed gas stream at 1000° C. for 5 minutes, and then cooled in an argon stream. The obtained monolayer N-graphene film and a thermal transfer film are pressed and stuck together, and then they are immersed in copper(II) chloride etchant, so that the copper undercoat is dissolved to transfer the monolayer N-graphene film onto the transfer film. Those procedures are repeated to stack four monolayer N-graphene films on the thermal transfer film. In this way, a multilayer graphene film is produced.

Thereafter, the thermal transfer film is laminated on a structure of a-ITO/silver-Pd alloy/a-ITO/PET film, and then heated to transfer the N-graphene film onto the structure of a-ITO/silver-Pd alloy/a-ITO/PET film to form a shielding layer 73.

The nitrogen content in the graphene film is measured by XPS, and found to be 1 to 2 atm % under the above conditions. The atomic ratio between carbon and oxygen is also measured by XPS, and found to be 100 to 200.

Subsequently, in the same manner as in Example 1, the shielding layer is coated with an isopropanol solution containing titanium (IV) isopropoxide and niobium (V) butoxide in such amounts that the content of niobium (V) butoxide is 5 wt % to that of titanium (IV) isopropoxide. The applied solution is dried in nitrogen at room temperature, and then dried on a hot-plate at 130° C. in an atmosphere having a humidity of 40% to produce a Nb-doped titanium oxide layer 74.

Meanwhile, the PET film surface on the side opposite to the electroconductive layer is screen-printed with UV-cut ink containing 2-hydroxy-4-methoxybenzophenone, to form a UV-cut layer 75. Finally, a silica film is formed by vacuum deposition to produce a gas-barrier layer 76 on the UV-cut layer. Thus, a transparent electrode 70 is obtained.

The transparent electrode is exposed from the gas-barrier layer side to visible light of 10 suns for 100 hours at a temperature of 80° C. and a humidity of 80%, and then evaluated by XPS. As a result, Ag is detected neither on the TiO$_x$ surface nor on the surface of the gas-barrier layer.

Example 8

Figure 8:
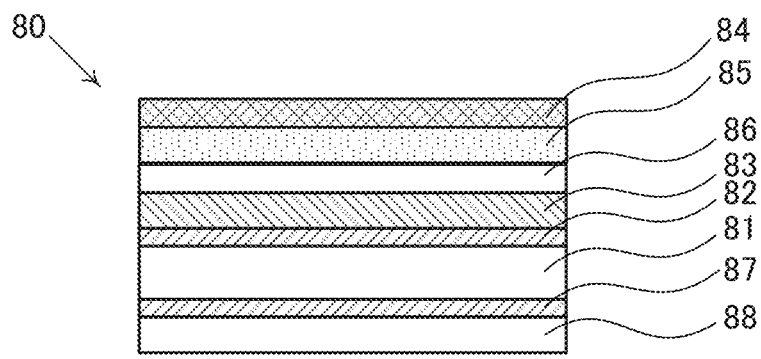
FIG. 8 is a schematic sectional view showing the structure of the solar cell in Example 8.

A solar cell shown in FIG. 8 is produced.

The transparent electrode 81 obtained in Example 1 is coated with a toluene solution of C60-DCBM by means of a bar-coater. The applied solution is dried to form an electron transport layer 82. Further, the layer is coated with a chlorobenzene solution containing C60-PCBM and poly(3-hexylthiophene-2,5-diyl) (hereinafter, referred to as "P3HT") by means of a bar-coater. The applied solution is dried at 100° C. for 20 minutes, to form a photoelectric conversion layer 83.

Meanwhile, a sheet of stainless steel-foil provided with an insulating ceramic film on one surface is prepared, and the other surface thereof is treated with dilute hydrochloric acid to remove a surface oxidized film. The surface thus treated was then coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to covert into a shielding layer 85. The shielding layer is a two-layer N-graphene film in which carbon atoms of the graphene oxide are partly substituted with nitrogen atoms.

The N-graphene film 85 is coated with an aqueous solution of PEDOT•PSS containing sorbitol by means of a bar-coater. The applied solution is dried at 100° C. for 30 minutes to form an adhesive layer 86 (thickness: 50 nm) containing PEDOT•PSS.

The obtained sheet is then so laminated at 90° C. on the photoelectric conversion layer 83 that the adhesive layer 86 may be in contacted with the conversion layer.

Subsequently, the PET film surface on the side opposite to the electroconductive layer is screen-printed with UV-cut ink containing 2-hydroxy-4-methoxybenzophenone, to form a UV-cut layer 87. Finally, a silica film is formed by vacuum deposition to produce a gas-barrier layer 88 on the UV-cut layer. Thus, a solar cell 80 is obtained.

The obtained solar cell converts sunlight of 1 sun at an efficiency of 5% or more. Even if the cell is left in the open air for a month, the efficiency deteriorates only by less than 2%.

Example 9

Figure 9:
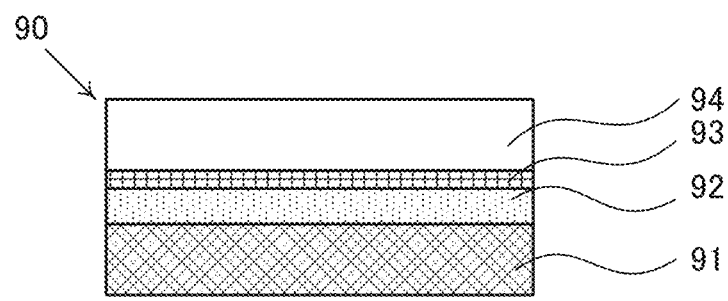
FIG. 9 is a schematic sectional view showing the structure of the organic EL device in Example 9.

An organic EL device 90 shown in FIG. 9 is produced.

On the titanium oxide surface of the transparent electrode 91 obtained in Example 1, a photoelectric conversion layer 92 serving as a luminous layer (40 nm) is formed by vapor-deposition of tris(8-hydroxyquinolinato)aluminum (Alq$_3$), which functions as an N-type semiconductor. Further, N,N'-di-1-naphthyl-N,N'-diphenyl-1,1'-biphenyl-4,4'-diamine (hereinafter, referred to as "NPD") is vapor-deposited thereon to form a hole transport layer 93 of 30 nm thickness. Furthermore, a metal electrode 94 is formed thereon by sputtering. Finally, the circumference is shielded to produce an organic EL device.

The obtained organic EL device hardly deteriorates in output light. Even after continuous operation for 1000 hours, the output decreases only by 7% or less.

Example 10

A transparent organic EL device is produced.

On the titanium oxide surface of the transparent electrode (negative electrode) obtained in Example 1, a photoelectric conversion layer serving as a luminous layer (40 nm) is formed by vapor-deposition of tris(8-hydroxyquinolinato) aluminum (Alq$_3$), which functions as an n-type semiconductor. Further, N,N'-di-1-naphthyl-N,N'-diphenyl-1,1'-biphenyl-4,4'-diamine (hereinafter, referred to as "NPD") is vapor-deposited thereon to form a hole transport layer of 30 nm thickness.

The hole transport layer is then coated with a methanol solution of nickel acetate by means of a bar-coater. The applied solution is dried at 130° C. for 10 minutes to form an amorphous and continuous NiO$_x$ layer (thickness: 20 nm). On the formed NiO$_x$ layer, a structure of a-ITO (40 nm)/silver (10 nm)/a-ITO (50 nm) is formed by sputtering to produce a transparent electrode (positive electrode). Finally, the circumference is shielded to produce a transparent organic EL device.

The obtained organic EL device hardly deteriorates in output light. Even after continuous operation for 1000 hours, the output decreases only by 7% or less.

Example 11

Figure 10:
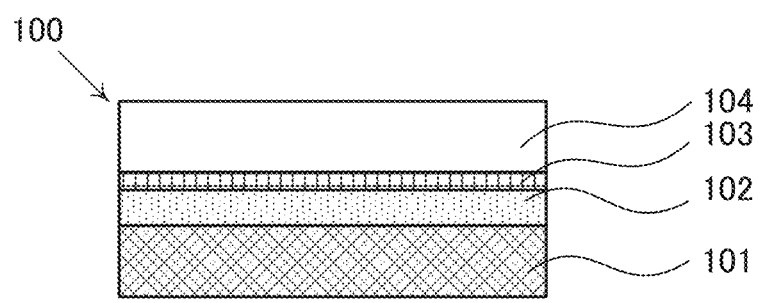
FIG. 10 is a schematic sectional view showing the structure of the liquid crystal cell in Example 11.

A liquid crystal cell 100 shown in FIG. 10 is produced.

A transparent electrode 101 is formed in the same manner as that in Example 6. The AlO$_x$ surface of the electrode is then coated with an aqueous dispersion of liquid crystal microcapsules. The applied dispersion is dried to form a liquid crystal microcapsule layer 102. Subsequently, the microcapsule layer is coated with an aqueous dispersion of PEDOT•PSS containing sorbitol. The applied dispersion is then dried to form an electroconductive adhesive layer 103. Meanwhile, a transparent electrode 104 is produced in the same manner as that in Example 4. The transparent electrode 104 is so laminated on the adhesive layer that the SiO$_x$ surface of the electrode may be in contacted with the adhesive layer. Finally, the circumference is shielded to produce a liquid crystal cell. This device is opaque, but becomes transparent under application of voltage. Accordingly, it can serve as an optical switch.

The obtained liquid crystal cell hardly deteriorates in drive voltage light. Even after continuous operation for 1000 hours, the voltage increases only by 5% or less.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A method for manufacturing an electronic device, the method comprising:
   (I) preparing a transparent substrate,
   (II) preparing a laminate structure of
      a first metal oxide layer having an amorphous structure and electroconductivity,
      a metal layer which comprises a metallic material containing silver or copper, and
      a second metal oxide layer having an amorphous structure and electroconductivity,
      on said transparent substrate,
   (III) forming a third metal oxide layer having an amorphous structure and continuity on a surface of said second metal oxide layer, (IV) forming a photoelectric conversion layer on a surface of said third metal oxide layer, and
(V) forming a counter electrode on a surface of said photoelectric conversion layer.

2. The method according to claim 1, further comprising:
(IIIa) forming a graphene layer which is placed in direct contact with said third metal oxide layer before or after the forming (III).

3. The method according to claim 1, further comprising forming a charge buffer layer or a charge transport layer between said photoelectric conversion layer and said third metal oxide layer or between said photoelectric conversion layer and said counter electrode.

4. The method according to claim 1, wherein the forming (III) comprises coating a metal alkoxide solution on the surface of said second metal oxide layer and drying.

5. The method according to claim 2, wherein the forming (IIIa) comprises coating an aqueous solution of graphene oxide to form a coated film and then treating said coated film with hydrazine hydrate to form said graphene layer.

6. The method according to claim 2, wherein the forming (IIIa) comprises forming said graphene layer on a copper foil by a CVD process and then transferring said graphene layer.

7. The method according to claim 1, wherein said counter electrode is formed by lamination in the forming (V).

8. The method according to claim 4, wherein said metal alkoxide solution further comprises other ion having a valence different from a metal constituting said metal oxide.

9. The method according to claim 1, further comprising: forming a UV-cut layer or a gas-barrier layer.

* * * * *